(12) United States Patent
Joseph et al.

(10) Patent No.: US 11,398,377 B2
(45) Date of Patent: Jul. 26, 2022

(54) BILAYER HARDMASK FOR DIRECT PRINT LITHOGRAPHY

(71) Applicant: International Business Machines Corporation, Armonk, NY (US)

(72) Inventors: Praveen Joseph, White Plains, NY (US); Gauri Karve, Cohoes, NY (US); Yann Mignot, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 351 days.

(21) Appl. No.: 16/741,915

(22) Filed: Jan. 14, 2020

(65) Prior Publication Data
US 2021/0217624 A1 Jul. 15, 2021

(51) Int. Cl.
*H01L 21/033* (2006.01)
*H01L 21/308* (2006.01)
*H01L 21/3065* (2006.01)

(52) U.S. Cl.
CPC ...... *H01L 21/0332* (2013.01); *H01L 21/3065* (2013.01); *H01L 21/3081* (2013.01)

(58) Field of Classification Search
CPC ............. H01L 21/0332; H01L 21/0334; H01L 21/7681; H01L 21/76811; H01L 21/308–3088; H01L 21/31144; H01L 21/32; H01L 21/32139; H01L 21/467; H01L 21/475; H01L 21/469–47576
See application file for complete search history.

(56) References Cited

U.S. PATENT DOCUMENTS

| | | | | |
|---|---|---|---|---|
| 4,484,979 A * | 11/1984 | Stocker | ............... | H01L 21/0337 257/E21.252 |
| 5,895,740 A * | 4/1999 | Chien | ............... | H01L 21/76816 216/17 |
| 6,399,286 B1 * | 6/2002 | Liu | .................... | H01L 21/32139 257/E21.582 |
| 6,764,903 B1 | 7/2004 | Chan et al. | | |
| 7,186,656 B2 | 3/2007 | Sreenivasan | | |
| 7,226,853 B2 | 6/2007 | Bekiaris et al. | | |
| 8,796,150 B2 | 8/2014 | Akinmade-Yusuff et al. | | |
| 8,883,648 B1 * | 11/2014 | Hsieh | ................ | H01L 21/31144 438/689 |
| 9,330,988 B1 * | 5/2016 | Adderly | ................... | H01L 22/20 |
| 9,627,321 B2 | 4/2017 | Boyanov et al. | | |
| 9,831,124 B1 | 11/2017 | Zhang et al. | | |
| 9,978,607 B2 | 5/2018 | Lin et al. | | |
| 10,032,631 B1 | 7/2018 | Chen et al. | | |
| 10,168,075 B2 | 1/2019 | Chen et al. | | |
| 10,276,378 B1 * | 4/2019 | Wu | ................... | H01L 21/31144 |

(Continued)

*Primary Examiner* — Scott B Geyer
(74) *Attorney, Agent, or Firm* — Cantor Colburn LLP; Abdy Raissinia

(57) ABSTRACT

A bilayer hardmask is formed on layers, the bilayer hardmask including a first hardmask layer and a second hardmask layer on the first hardmask layer. A first pattern is formed in the second hardmask layer, the first pattern including tapered sidewalls forming a first spacing in the second hardmask layer. A second pattern is formed in the first hardmask layer based on the first pattern, the second pattern comprising vertical sidewalls forming a second spacing in the first hardmask layer, the second spacing being reduced in size from the first spacing.

20 Claims, 15 Drawing Sheets

(56) References Cited

U.S. PATENT DOCUMENTS

| | | | |
|---|---|---|---|
| 2004/0178169 A1* | 9/2004 | Desphande | H01L 21/31144 257/E21.252 |
| 2005/0056823 A1* | 3/2005 | Allen | H01L 21/0338 257/E21.252 |
| 2010/0009542 A1* | 1/2010 | Honda | H01L 21/0212 257/E21.241 |
| 2010/0327412 A1* | 12/2010 | Lee | H01L 21/0337 257/618 |
| 2012/0244710 A1* | 9/2012 | Chumakov | H01L 21/31144 257/E21.257 |
| 2013/0137269 A1* | 5/2013 | Geiss | H01L 21/0337 438/697 |
| 2013/0214391 A1* | 8/2013 | Choi | H01L 23/528 257/622 |
| 2014/0217555 A1* | 8/2014 | Ohnuki | H01L 21/3086 257/618 |
| 2014/0227878 A1 | 8/2014 | Yang et al. | |
| 2019/0067022 A1* | 2/2019 | Lin | H01L 23/528 |
| 2020/0051909 A1* | 2/2020 | Kim | H01L 21/76804 |

* cited by examiner

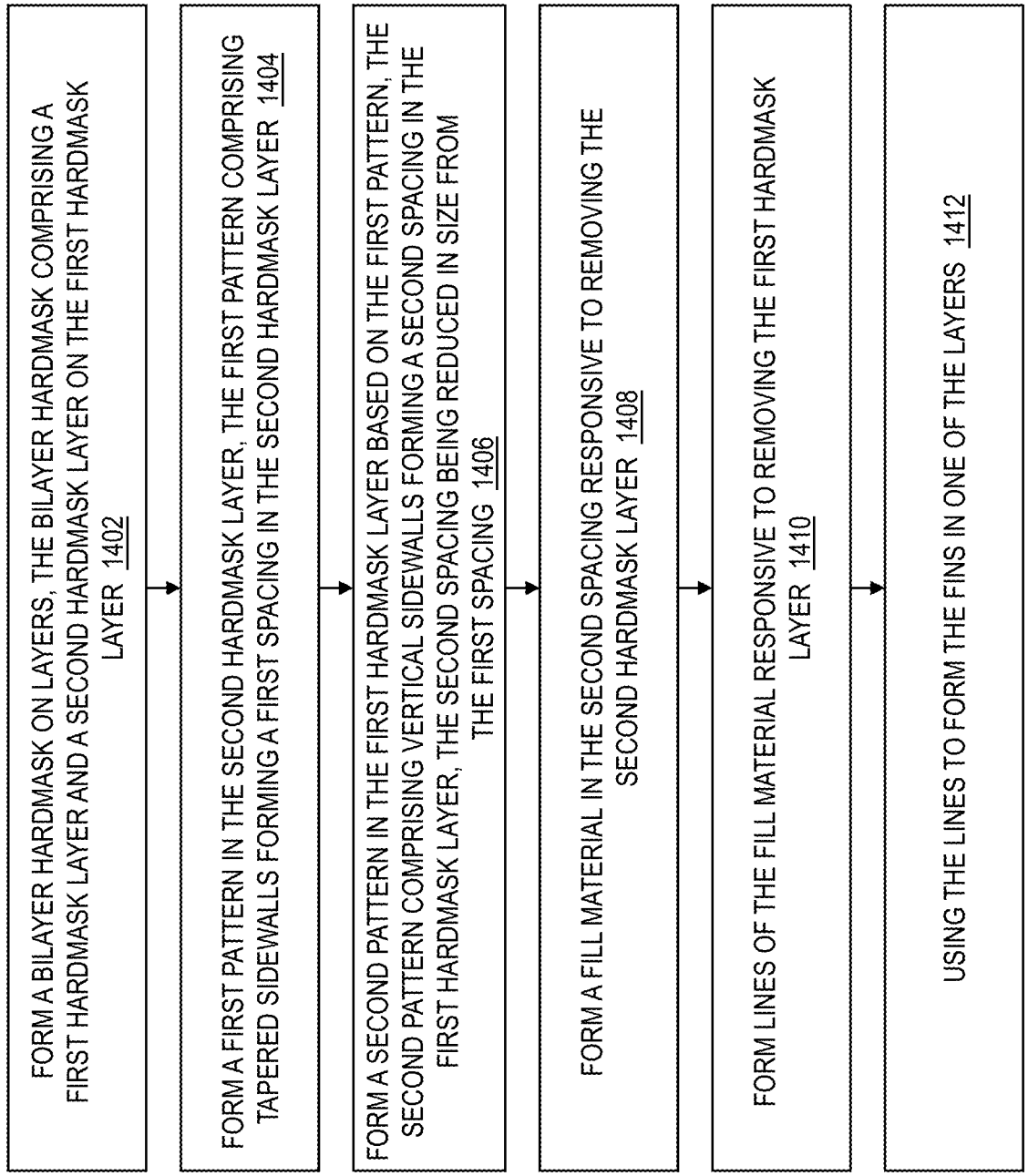

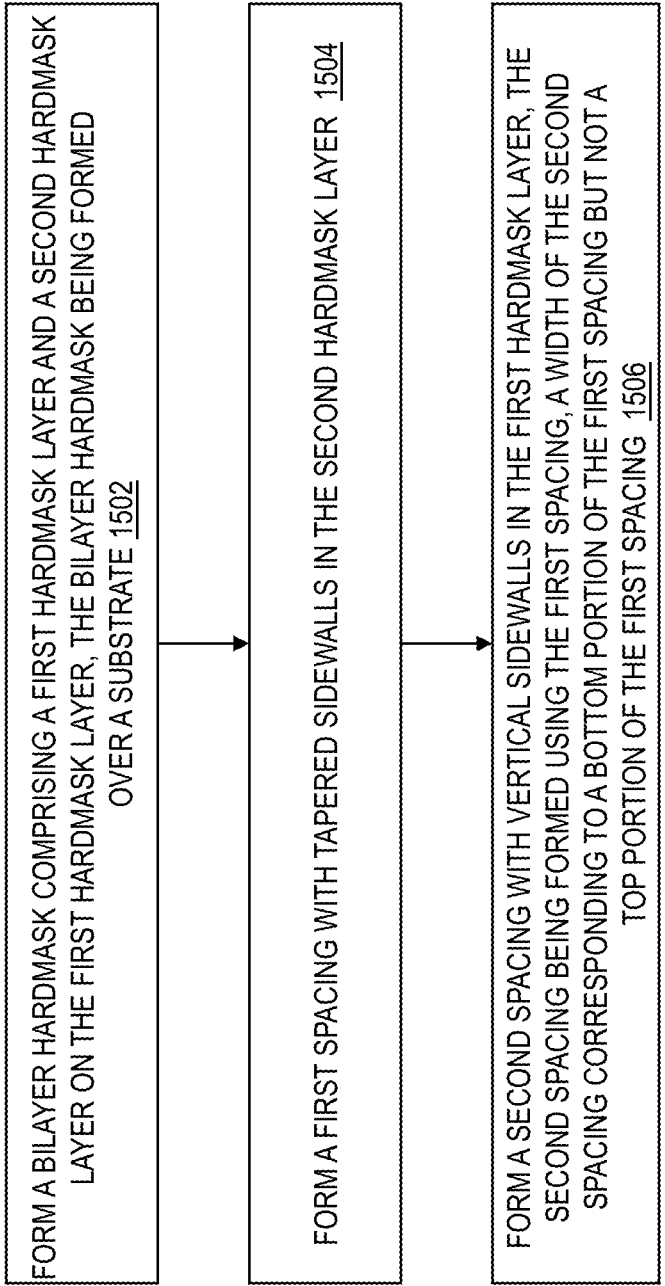

BILAYER HARDMASK FOR DIRECT PRINT LITHOGRAPHY

BACKGROUND

The present invention generally relates to fabrication methods and resulting structures for semiconductor devices, and more specifically, to a bilayer hardmask process for tone invert direct print lithography.

The fabrication of an integrated circuit (IC) requires a variety of physical and chemical processes performed on a semiconductor substrate (e.g., silicon). In general, the various processes used to make an IC can fall into three categories which include film deposition, patterning, and semiconductor doping. Films of both conductors and insulators are used to connect and isolate transistors and their components. Selective doping of various regions of silicon allow the conductivity of the silicon to be changed with the application of voltage. By creating structures of these various components, millions of transistors can be built and wired together to form the complex circuitry of a modern microelectronic device. Fundamental to all of these processes is lithography, i.e., the formation of three-dimensional relief images on the substrate for subsequent transfer of the pattern to the substrate. Photolithography, also called optical lithography or ultraviolet (UV) lithography, is a process used in microfabrication to pattern parts of a thin film or the bulk of a substrate (e.g., also called a wafer). It uses light to transfer a geometric pattern from a photomask (also called an optical mask) to a photosensitive chemical photoresist on the substrate. A series of treatments etch the exposure pattern into the material or enables deposition of a new material in the desired pattern upon the material underneath the photoresist. In some cases, a wafer might proceed through the photolithographic cycle as many as 50 times or more.

SUMMARY

Embodiments of the invention are directed to a bilayer hardmask process for direct print lithography. A non-limiting example of a method for forming a semiconductor device includes forming a bilayer hardmask on layers, the bilayer hardmask including a first hardmask layer and a second hardmask layer on the first hardmask layer, and forming a first pattern in the second hardmask layer, the first pattern including tapered sidewalls forming a first spacing in the second hardmask layer. Also, the method includes forming a second pattern in the first hardmask layer based on the first pattern, the second pattern comprising vertical sidewalls forming a second spacing in the first hardmask layer, the second spacing being reduced in size from the first spacing.

A non-limiting example of a method for forming fins in a semiconductor device includes forming a bilayer hardmask on layers, the bilayer hardmask including a first hardmask layer and a second hardmask layer on the first hardmask layer, and forming a first pattern in the second hardmask layer, the first pattern including tapered sidewalls forming a first spacing in the second hardmask layer. The method includes forming a second pattern in the first hardmask layer based on the first pattern, the second pattern including vertical sidewalls forming a second spacing in the first hardmask layer, the second spacing being reduced in size from the first spacing. Also, the method includes forming a fill material in the second spacing responsive to removing the second hardmask layer, forming lines of the fill material responsive to removing the first hardmask layer, and using the lines to form the fins in one of the layers.

A non-limiting example of a method for forming a semiconductor device includes forming a bilayer hardmask including a first hardmask layer and a second hardmask layer on the first hardmask layer, the bilayer hardmask being formed over a substrate, and forming a first spacing with tapered sidewalls in the second hardmask layer. The method includes forming a second spacing with vertical sidewalls in the first hardmask layer, the second spacing being formed using the first spacing, a width of the second spacing corresponding to a bottom portion of the first spacing but not a top portion of the first spacing.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 14 is a flow chart of a method for forming fins in a semiconductor device according to embodiments of the invention; and FIG. 15 is a flow chart of a method for forming a semiconductor device according embodiments of the invention.

Figure 1:
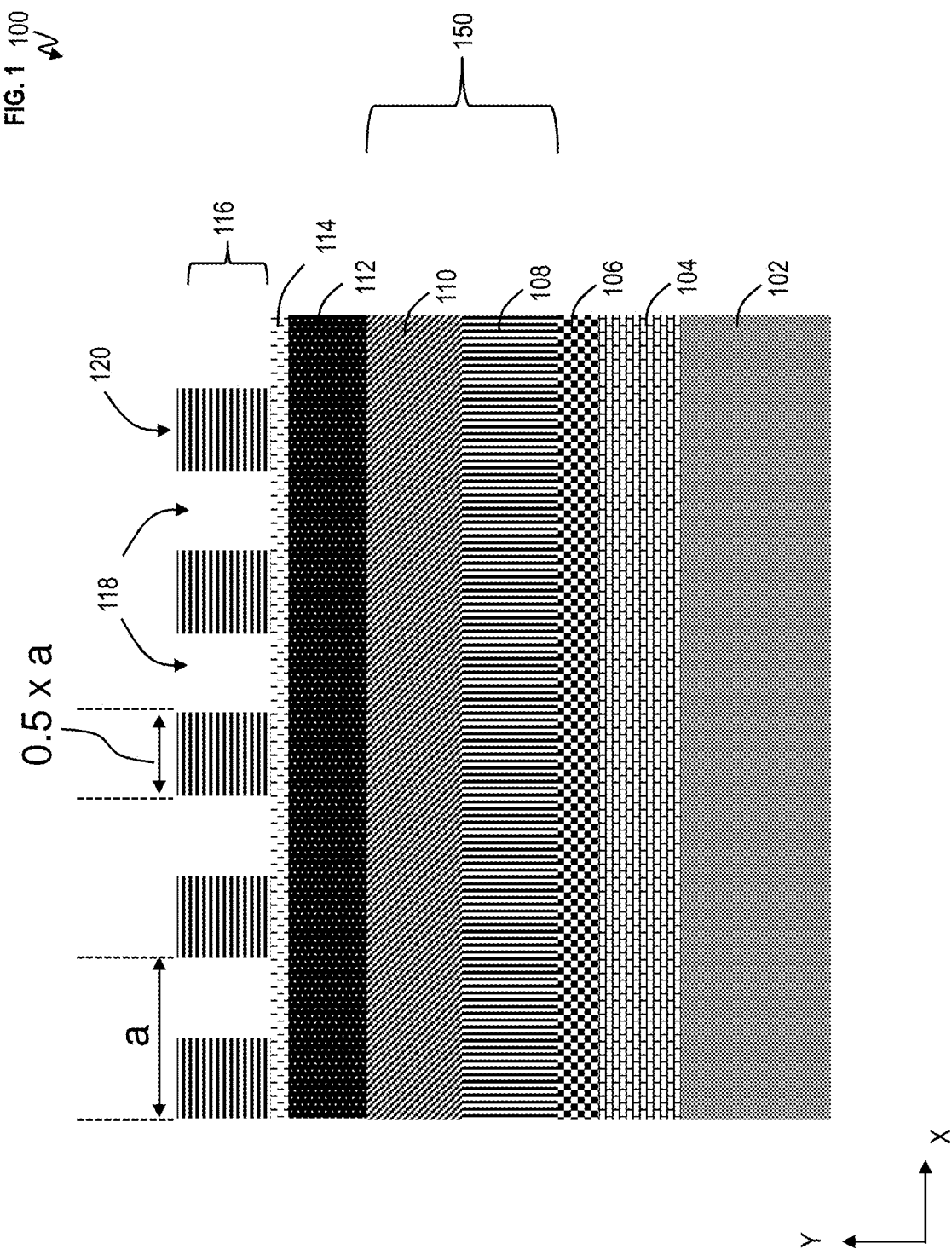
FIG. 1 depicts a cross-sectional view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of aspects of the invention, one or more embodiments of the invention provide a bilayer hardmask material for lithographically defined pattern transfer. The top layer of the bilayer hardmask material is used to shrink the trench width but takes on tapered sidewall of the trench due to etching space shrinkage, for example, reactive ion etching (ME) shrinkage. The bottom layer of the bilayer hardmask material is a direct pattern transfer of the shrunk trench width without needing to alter the width anymore. Accordingly, one or more embodiments of the invention provide a narrower trench width in the bottom layer of the bilayer hardmask material which is needed to enable a direct print tone inverse process to pattern fins at a low duty cycle, without having the need to adopt complex multiple patterning schemes such as a self-aligned double patterning (SADP) scheme. Although direct print lithography of low duty cycle structures can be challenging, one or more embodiments of the invention provide new techniques to form the low duty cycle structure. The duty cycle is the ratio of line width to space width. For example, a line/space array of line pitch 100 nm and linewidth 50 nm, has a duty cycle of 1:1 because the linewidth is 50 nm and the space is 50 nm, while a line/space array of line pitch 100 nm and linewidth 10 nm, has a duty cycle of 1:9.

According to one or more embodiments of the invention, using the bottom layer of the hardmask material with the shrunk trench width (e.g., narrow trench), a fill material is deposited in the trenches to conform to the shrunk trench width. A selective deposition process can be utilized to fill the trenches by a bottom-up fill mechanism in order to invert the tone. Pillars/lines of the fill material can be utilized as a mask to eventually form narrow fins for transistors without the need to adopt complex multiple patterning schemes.

Turning now to a more detailed description of aspects of the present invention, FIG. 1 depicts a cross-sectional view of a semiconductor device 100 according to embodiments of the invention. The semiconductor device 100 can be utilized to make a metal-oxide-semiconductor field-effect transistor (MOSFET). Particularly, the semiconductor device 100 can be utilized in the process of forming fins and/or masks for fins used in a fin type field effect transistor (finFET), which is a type of nonplanar MOSFET. FinFET devices include an arrangement of fins disposed on a substrate as understood by one skilled in the art.

The semiconductor device 100 can be formed using standard lithography processing. After initial fabrication processing, the semiconductor device 100 includes a fin hardmask layer 104 deposited on substrate 102. The substrate 102 can be a wafer. Example materials of the substrate can include silicon (Si), silicon germanium (SiGe), III-V semiconductors, etc.

The fin hardmask layer 104 can be a fin hardmask stack. For example, the fin hardmask stack can include a stack of silicon nitride on top of silicon dioxide which is on top of silicon nitride (e.g., N/O/N). Other example materials of the fin hardmask layer 104 can include silicon dioxide only (i.e., not part of a stack of materials) and silicon nitride only (i.e., not part of a stack of materials). Additionally, aluminum oxide, titanium dioxide, and titanium nitride can be part of the fin hardmask stack for the fin hardmask layer 104 and/or can separately be the material of the fin hardmask layer 104.

An intermediary layer 106 can be deposited on the fin hardmask layer 104, and a bilayer hardmask stack 150 is deposited on the intermediary layer 106. The intermediary layer 106 can be amorphous silicon. Other example materials of the intermediary layer 106 can include amorphous carbon. In one or more embodiments of the invention, the intermediary layer 106 can be omitted and the bilayer hardmask stack 150 can be formed directly on fin hardmask layer 104. The bilayer hardmask stack 150 includes a first/bottom hardmask layer 108 formed on intermediary layer 106 and/or formed on fin hardmask layer 104 (when the intermediary layer 106 is omitted). The bilayer hardmask stack 150 includes a second/top hardmask layer 110 formed on the first hardmask layer 108.

The first hardmask layer 108 is made from a different material from the material of second hard mask layer 110. The materials chosen for the first hardmask layer 108 and the second hardmask layer 110 are selected to have different etch rates such that one material can be etched without etching the other. The first hardmask layer 108 can be, for example, a nitride such as silicon nitride while the second hardmask 110 can be, for example, an oxide such as silicon dioxide. In this example, silicon dioxide and silicon nitride can be etched selective to one another. In other cases, the example materials of the first hardmask layer 108 and second hardmask layer 110 can be interchanged, for example, where first hardmask layer 108 can be the oxide such as silicon dioxide and the second hardmask layer 110 can be the nitride such as silicon nitride.

A planarization layer 112 is deposited on the bilayer hardmask stack 150, particularly on the second hardmask layer 110. The planarization layer 112 can be an organic planarization layer (OPL), organic dielectric layer (ODL), etc. An anti-reflective material 114 can be formed on top of the planarization layer 112. The anti-reflective material 114 can be a silicon-based material, including but not limited to silicon anti-reflective coating (SiARC), silicon oxide, silicon oxynitride, etc. Other example materials of the anti-reflective material 114 can include aluminum nitride, titanium oxide, etc.

A photoresist material 116 is deposited on top of anti-reflective material 114, and the photoresist material 116 is patterned to have trenches/spaces 118 and lines 120 as shown in FIG. 1. The photoresist material 116 is patterned to have and/or be close to a 1 to 1 duty cycle, where, for example, the pitch rate is designated as "a", the line width is about (0.5)×(a), and therefore the trench width is also about (0.5)×(a). This means that the width of lines 120 and trenches/spaces 118 are equal or almost equal, and a duty cycle of 1:1 is easier to print using direct printing techniques.

Figure 2:
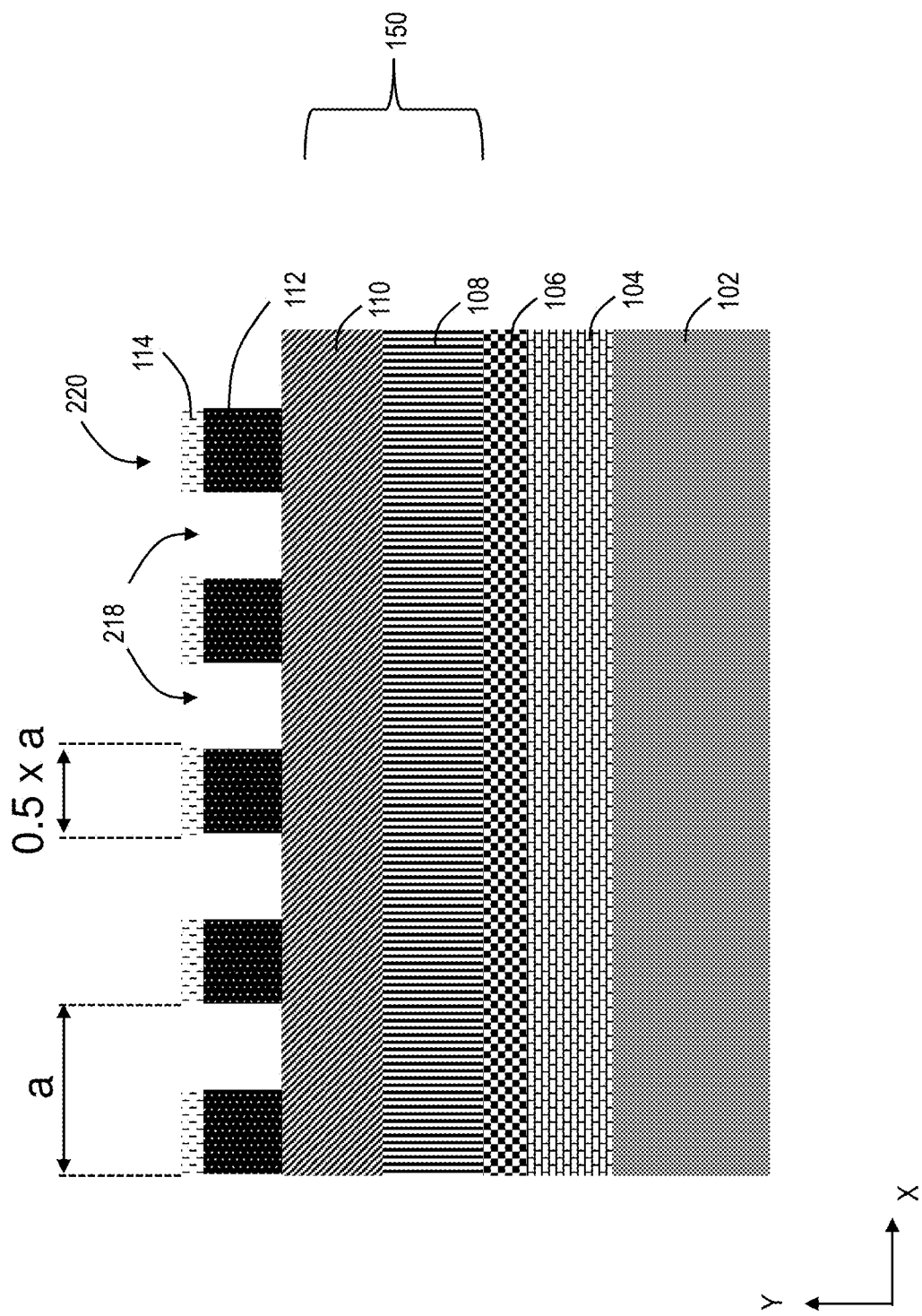
FIG. 2 depicts a cross-sectional view of the semiconductor device after fabrication operations according to embodiments of the invention.

FIG. 2 depicts a cross-sectional view of the semiconductor device 100 after fabrication operations according to embodiments of the invention. The pattern of photoresist material 116 is transferred to the lithography stack of planarization layer 112 and anti-reflective material 114, such that planarization layer 112 and anti-reflective material 114 are formed with trenches/spaces 218 having the same width as trenches/spaces 118 and lines 220 having the same width as lines 120. In one or more embodiments of the invention, the SiARC etch of anti-reflective material 114 can be etched using a $CF_4$ chemistry based RIE process. The planarization layer 112 can be etched using a $HBr/O_2$ based chemistry, $CO/CO_2$ based chemistry, and/or $H_2/N_2$ based chemistry. During the planarization layer 112 etch process, the remaining photoresist material 116 is removed.

Figure 3:
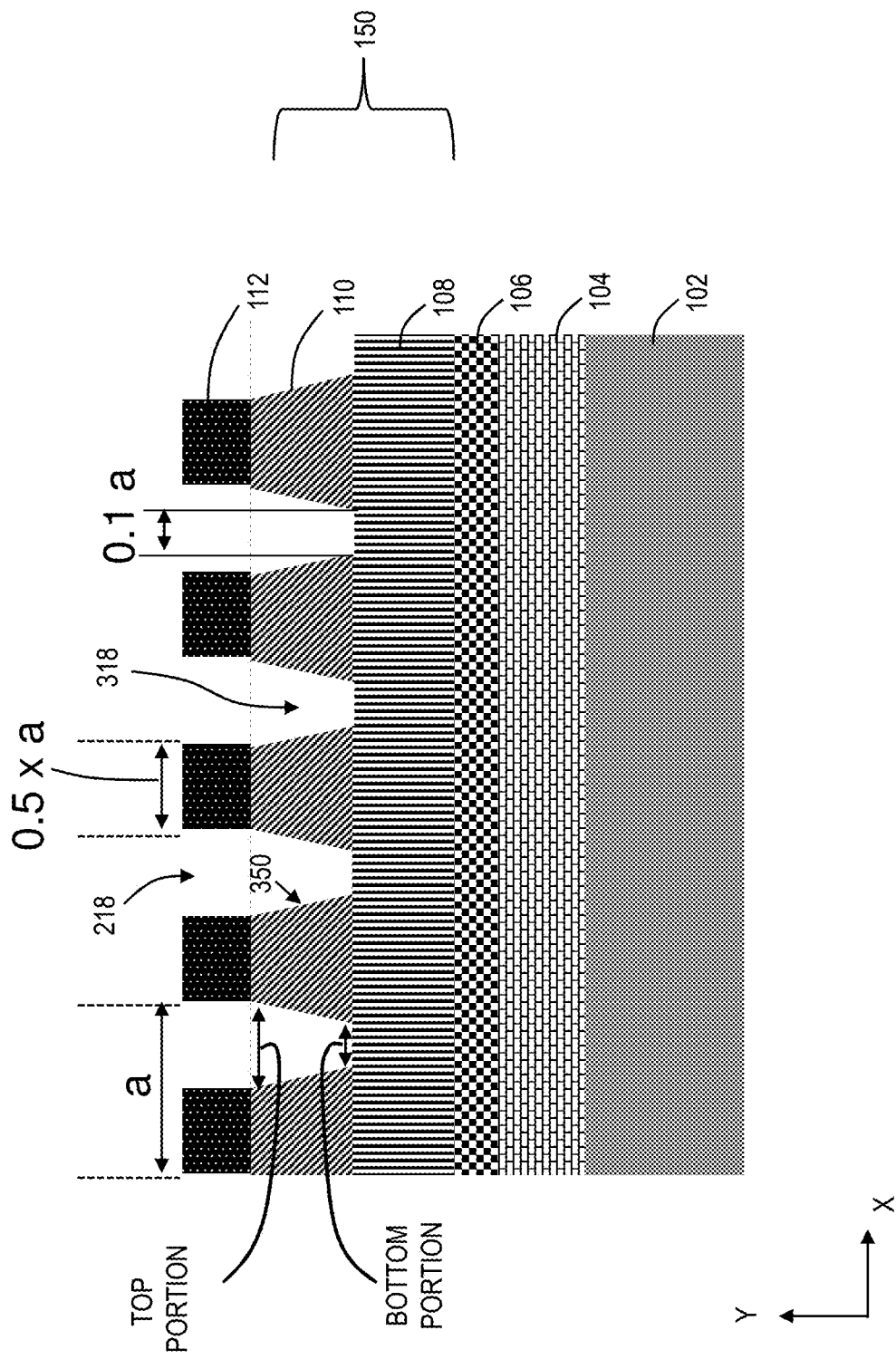
FIG. 3 depicts a cross-sectional view of the semiconductor device after fabrication operations according to embodiments of the invention.

FIG. 3 depicts a cross-sectional view of the semiconductor device 100 after fabrication operations according to embodiments of the invention. The pattern of the planarization layer 112 (and anti-reflective material 114) is transferred into the second hardmask layer 110 while shrinking the trench width. Reactive ion etching can be utilized to etch the second hardmask layer 110. In one or more embodiments of the invention, the silicon dioxide etch of the second hardmask layer 110 can be etched using a $C_4F_8$ based chemistry, and the SiARC anti-reflective material 114 burns-off during this process.

As a result of the polymer rich $C_4F_8$ based plasma etch process, the second hardmask layer 110 has tapered sidewalls 350 which make the linewidth narrower at the top and (become) wider at the bottom, when traversing along the y-axis. As well, the second hardmask layer 110 is formed with trenches/spaces 318, which are wider in the x-axis at the top portion and become narrower at the bottom portion, when traversing along the y-axis. Patterning the second hardmask layer 110 is utilized to shrink the trench width/ space in the x-axis from about (0.5)×(a) at the top portion to about (0.1)×(a) at the bottom portion, where "a" is the pitch of the line-space pattern noted above. The pitch "a" can range from about 30 to about 100 nanometers (nm), and could be 30 nm, 40 nm, 50 nm, 60 nm, etc. Accordingly, the shrunk trench at the bottom portion of trench/space 318 can range from about 3 nm to about 10 nm, and particularly be 3 nm, 4 nm, 5 nm to (ultimately) result in masks for narrow fins.

Figure 4:
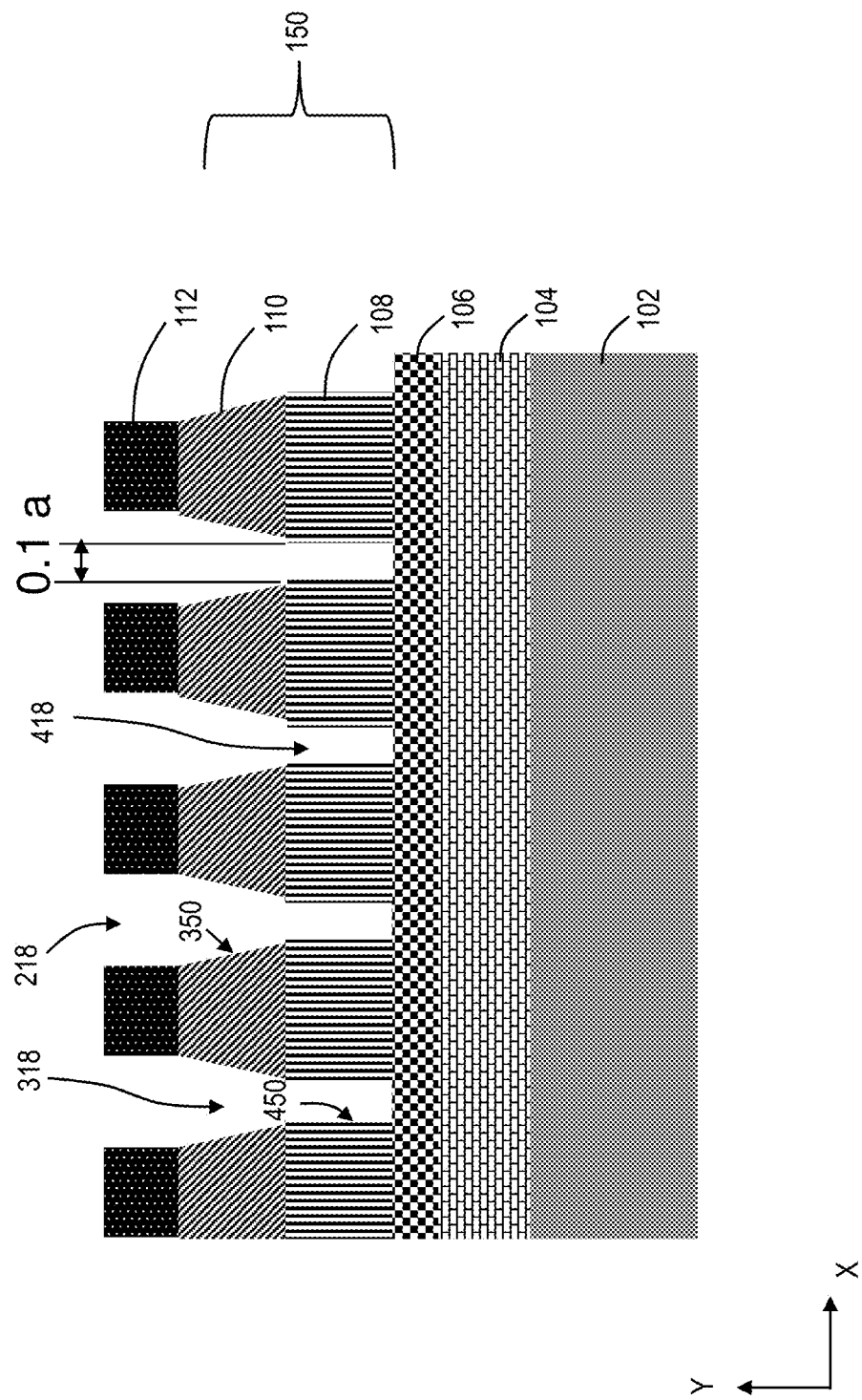
FIG. 4 depicts a cross-sectional view of the semiconductor device after fabrication operations according to embodiments of the invention.

FIG. 4 depicts a cross-sectional view of the semiconductor device 100 after fabrication operations according to embodiments of the invention. The pattern of the shrunk trench width as the bottom portion of second hardmask 110 is transferred into the first hardmask layer 108. A directional etch such as reactive ion etching (ME) can be utilized to form trenches/spaces 418 in the first hardmask layer 108. Accordingly, the trenches/spaces 418 have the width (0.1)× (a) in the x-axis. As noted above, the trenches/spaces 418 now have a width in the x-axis which ranges from about 3 nm to about 10 nm, and particularly 3 nm, 4 nm, 5 nm to (ultimately) result in masks for narrow fins. The first hardmask layer 108 has straight/vertical sidewalls 450 and not the tapered sidewalls of the second hardmask layer 108. The first hardmask layer 108 is a direct pattern transfer of the shrunk trench width of second hardmask layer 110 without the need to alter the width anymore. This process achieves the shrunk trench (i.e., narrower) width which enables, for example, an extreme ultraviolet direct print tone inverse process to pattern fins at a low duty cycle, while avoiding complex multiple patterning schemes such as SADP.

Figure 5:
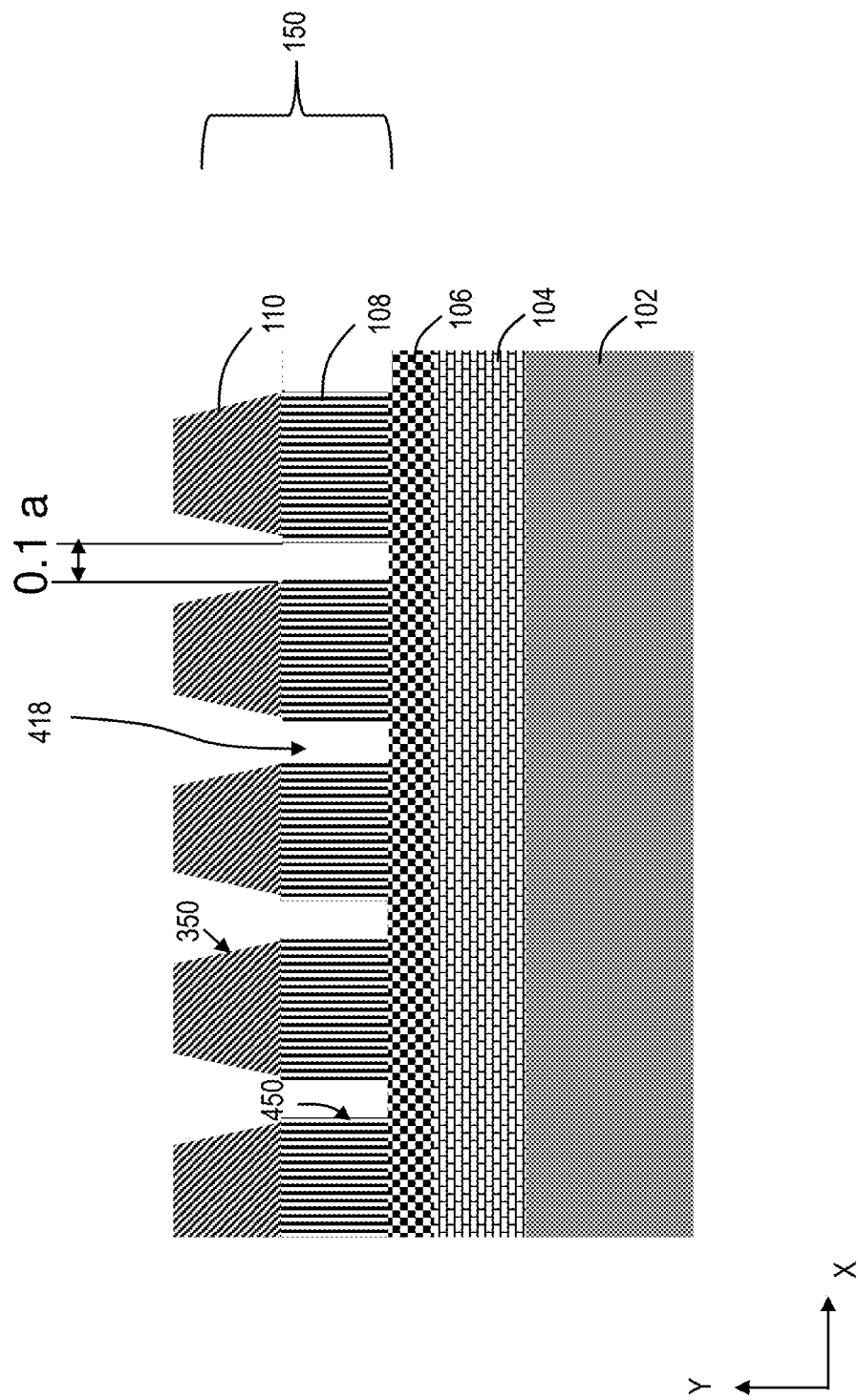
FIG. 5 depicts a cross-sectional view of the semiconductor device after fabrication operations according to embodiments of the invention.
Figure 6:
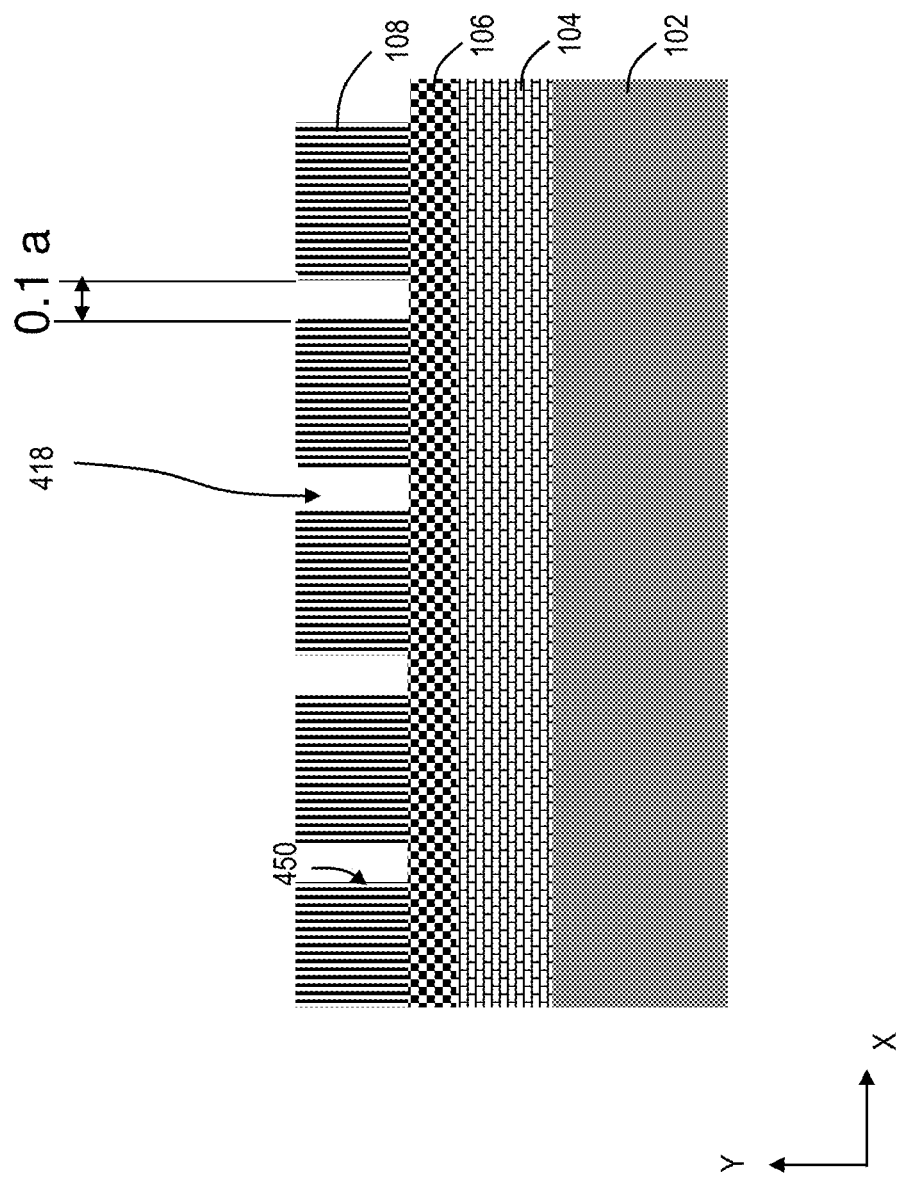
FIG. 6 depicts a cross-sectional view of the semiconductor device after fabrication operations according to embodiments of the invention.

The planarization layer 112 is removed as depicted in the cross-sectional view of the semiconductor device 100 FIG. 5. The planarization layer 112 can be removed by an $O_2$ plasma ash/strip. FIG. 6 depicts a cross-sectional view of the semiconductor device 100 after fabrication operations according to embodiments of the invention. The second hardmask layer 110 is removed. The second hardmask layer 110 can be removed by a wet etch. In one or more embodiments of the invention, a silicon dioxide etch of second hardmask layer 110 can be performed using buffered hydrofluoric acid wet chemistry.

Figure 7:
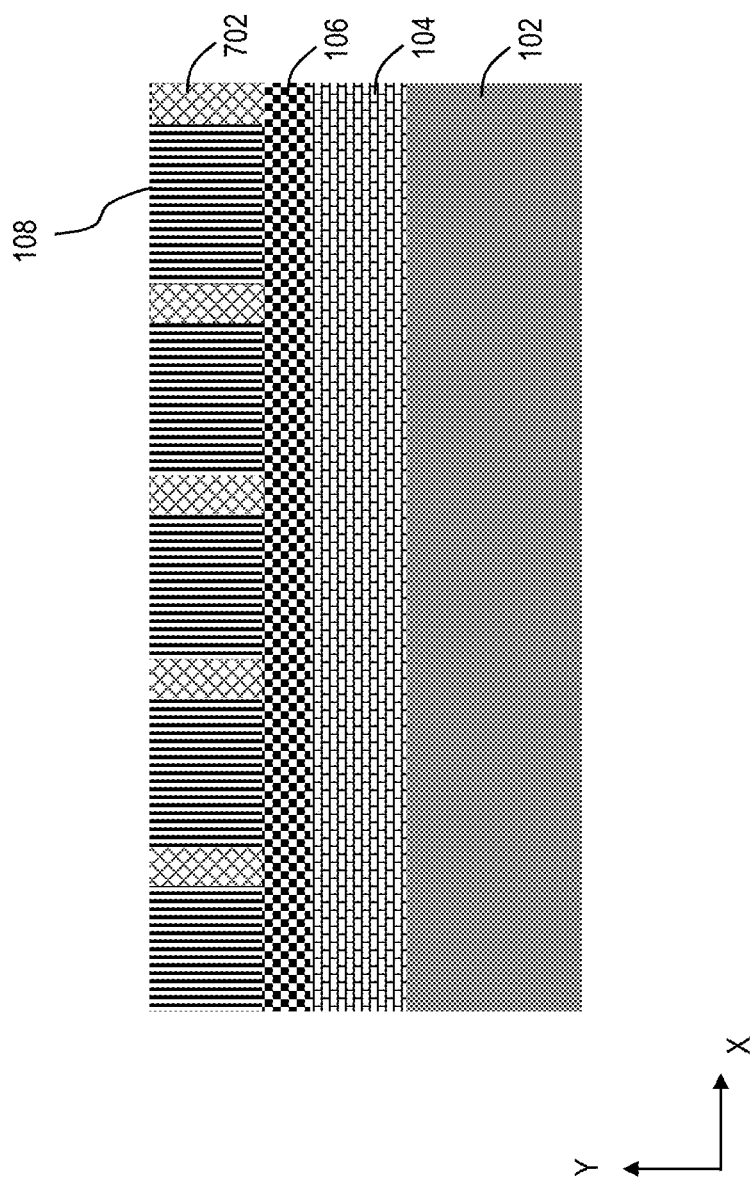
FIG. 7 depicts a cross-sectional view of the semiconductor device after fabrication operations according to embodiments of the invention.

FIG. 7 depicts a cross-sectional view of the semiconductor device 100 after fabrication operations according to embodiments of the invention. Trench fill material 702 is deposited in the trenches/spaces 418 of first hardmask layer 108, conforming to the vertical/straight sidewalls 405 and the shrunk width. The trench fill material 702 is utilized as a tone invert material. In one or more embodiments of the invention, the trench fill material 702 can be a metal oxide. Examples of metal oxides for the trench fill material 702 can include hafnium oxide ($HfO_2$), zirconium oxide ($ZrO_2$), titanium oxide ($TiO_2$), aluminum oxide ($Al_2O_3$), etc.

In one or more embodiments of the invention, the trench fill material 702 can be formed using selective deposition. For example, using selective deposition, the trench fill material 702 (only) deposits on the exposed intermediary layer 106 which can be amorphous silicon so as to fill the trenches/spaces 418 from the bottom up. The trench fill material 702 can be deposited using other deposition techniques. In one or more embodiments of the invention when the intermediary layer 106 is omitted, the trench fill material 702 is deposited on top of both the fin hardmask layer 104 and the first hardmask layer 108, and in this case, the excess trench fill material 702 can be removed when the first hardmask layer 108 is removed.

Figure 8:
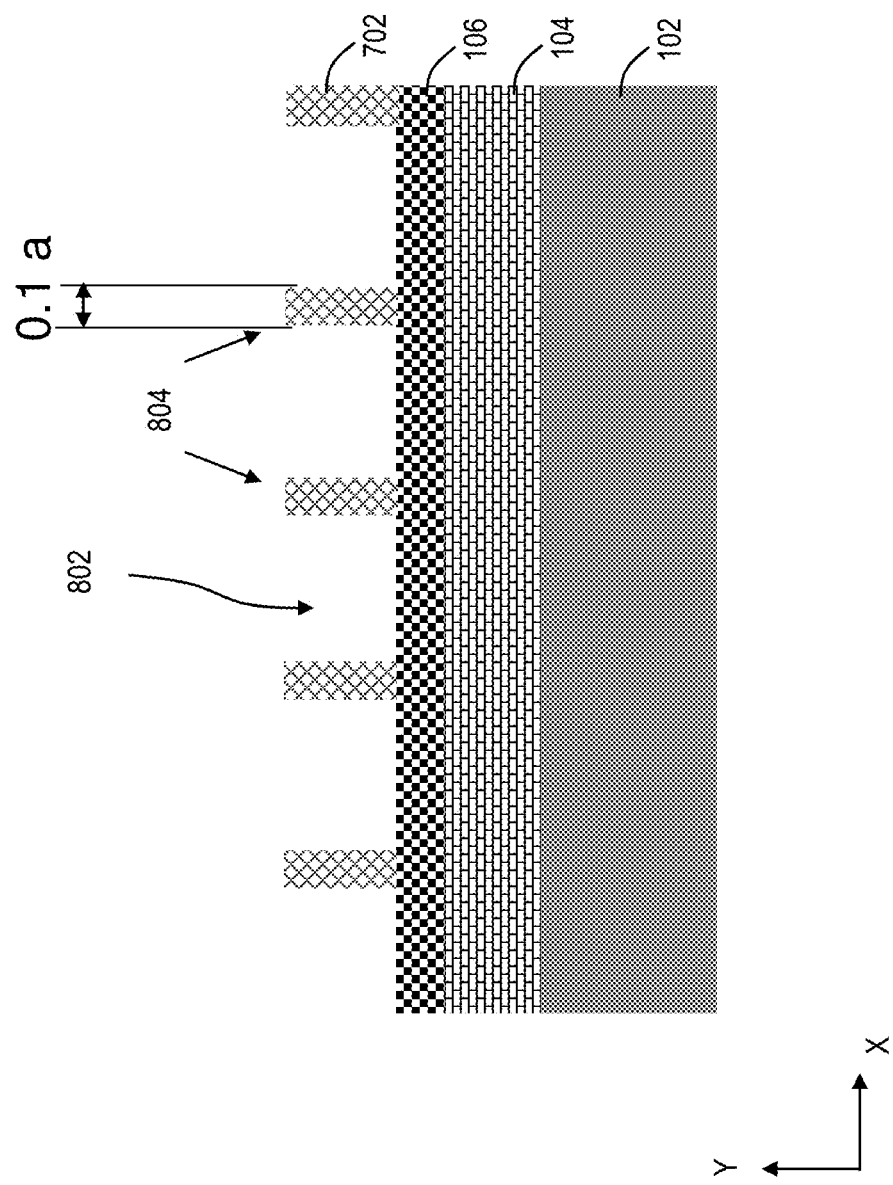
FIG. 8 depicts a cross-sectional view of the semiconductor device after fabrication operations according to embodiments of the invention.

FIG. 8 depicts a cross-sectional view of the semiconductor device 100 after fabrication operations according to embodiments of the invention. The first hardmask layer 108 is removed thereby leaving free-standing lines 804 of trench fill material 702. The lines 804 of trench fill material 702 have a width in the x-axis, corresponding to the trench/space width of trenches/spaces 418 (depicted in FIG. 4), which ranges from about 3 nm to about 10 nm, and particularly 3 nm, 4 nm, 5 nm. In one or more embodiments of the invention, the first hardmask layer 108 can be removed by reactive ion etching (ME). For example, a silicon nitride etch of first hardmask layer 108 can be performed using $CH_3F$ based ME chemistry. The bilayer hardmask process discussed above provides tone invert direct print lithography and results in the semiconductor device 100 depicted in FIG. 8. This bilayer hardmask process is an improvement over more complex processes while proving line widths of lines 804 which are much smaller than the trenches/spaces 802 in the x-axis. The bilayer hardmask process enables a high duty cycle, such as 1:6, 1:8, 1:10, etc. After utilizing the bilayer hardmask process discussed herein, one skilled in the art can continue fabrication operations as desired.

Figure 9:
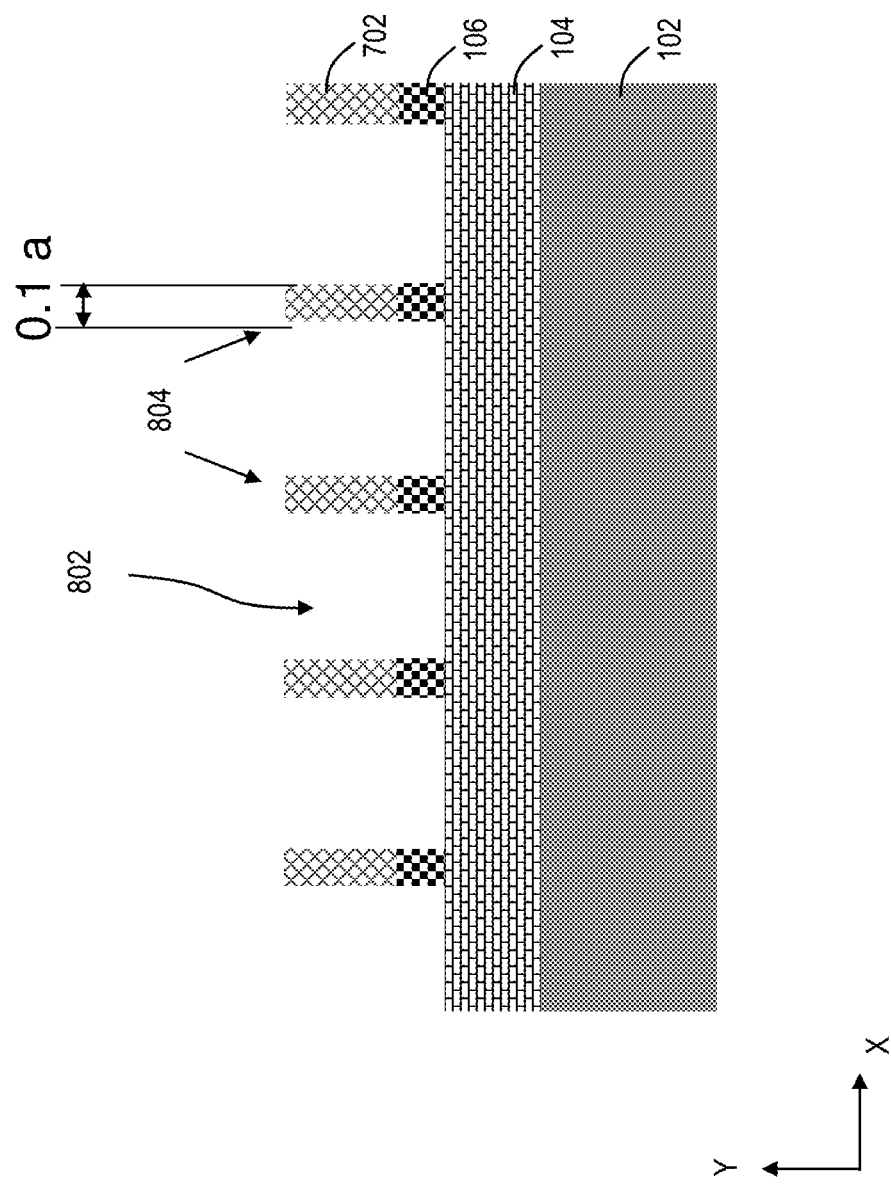
FIG. 9 depicts a cross-sectional view of the semiconductor device after fabrication operations according to embodiments of the invention.

FIG. 9 depicts a cross-sectional view of the semiconductor device 100 after fabrication operations according to embodiments of the invention. Etching of the intermediary layer 106 is performed to transfer the same width of the lines 804 of trench fill material 702 and width of the trenches/spaces 802 into intermediary layer 106. An amorphous silicon etch of intermediary layer 106 can be etched using, for example, SF6 based RIE chemistry.

Figure 10:
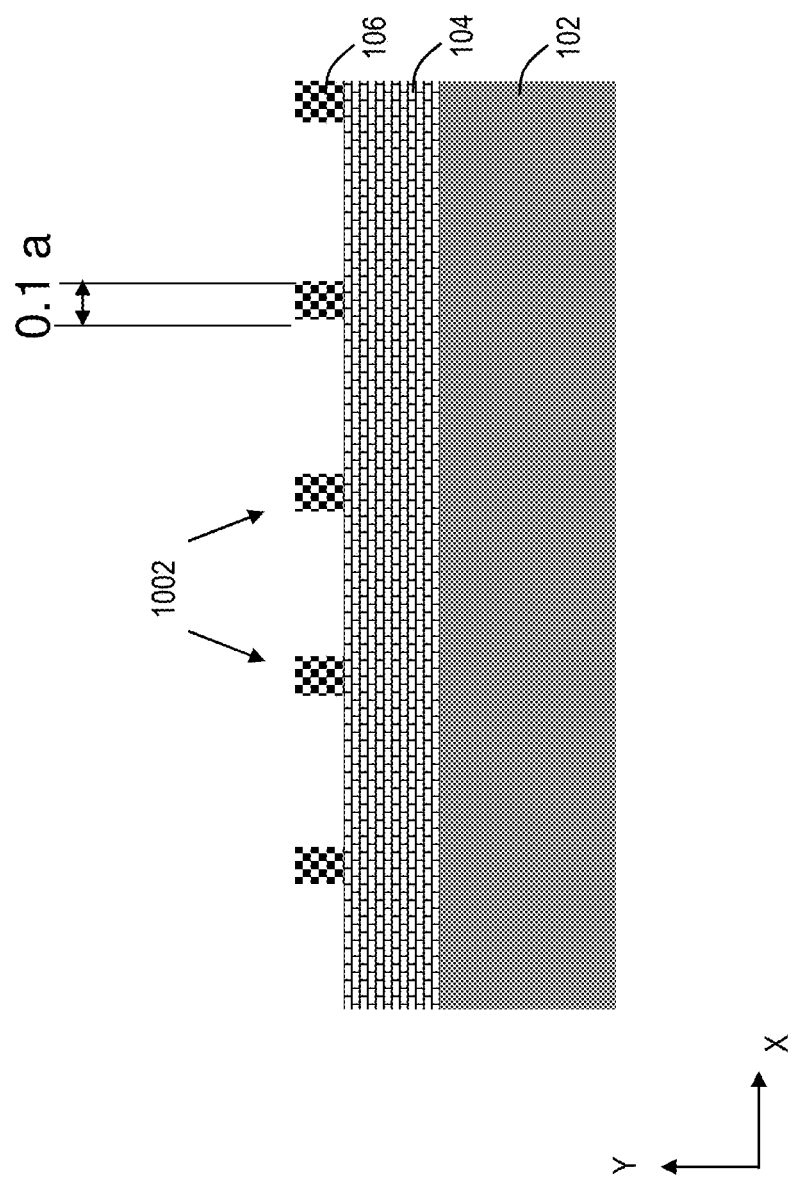
FIG. 10 depicts a cross-sectional view of the semiconductor device after fabrication operations according to embodiments of the invention.

FIG. 10 depicts a cross-sectional view of the semiconductor device 100 after fabrication operations according to embodiments of the invention. The lines 804 of trench fill material 702 are removed thereby leaving lines 1002 of intermediary layer 106.

Figure 11:
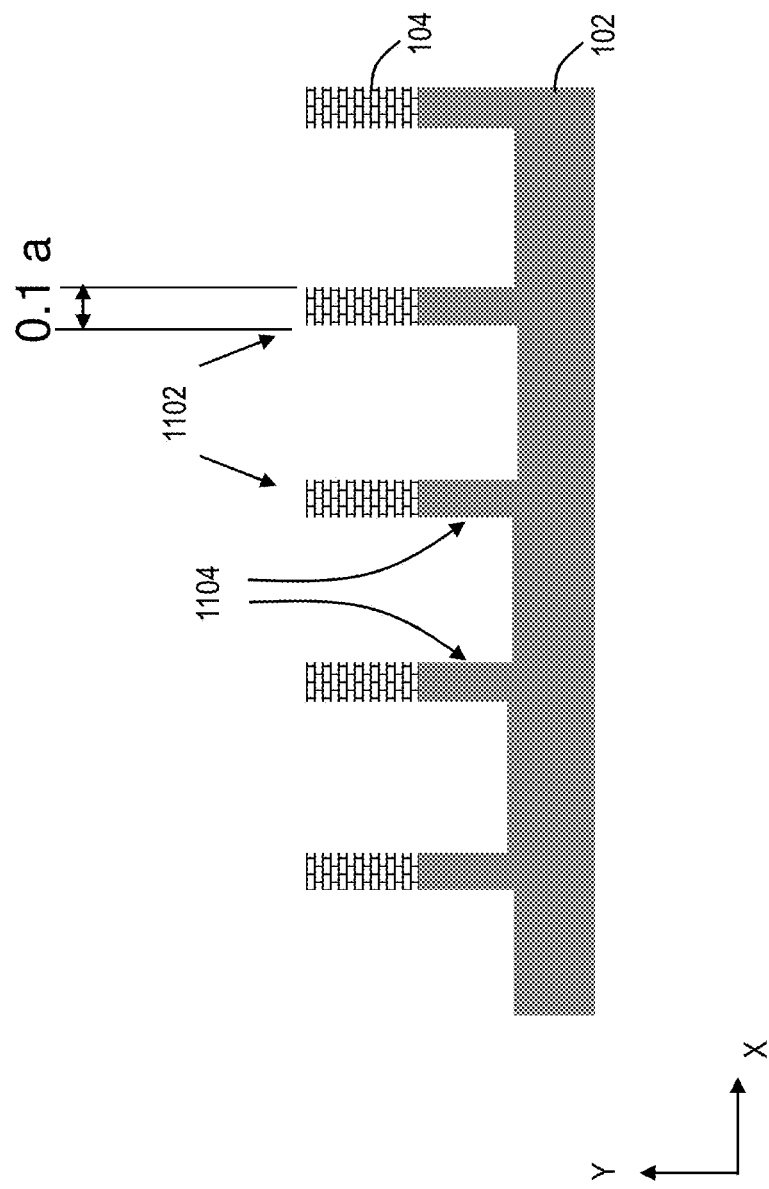
FIG. 11 depicts a cross-sectional view of the semiconductor device after fabrication operations according to embodiments of the invention.

FIG. 11 depicts a cross-sectional view of the semiconductor device 100 after fabrication operations according to embodiments of the invention. The pattern of the intermediary layer 106 is transferred to the fin hardmask layer 104. Etching is performed and the lines 1002 of intermediary layer 106 are utilized as the mask to etch fin hardmask layer 104. Reactive ion etching can be utilized. In one or more embodiments of the invention, the intermediary layer 106 is omitted, the lines 804 of trench fill material 702 can be utilized as the mask to etch the fin hardmask layer 104.

Figure 12:
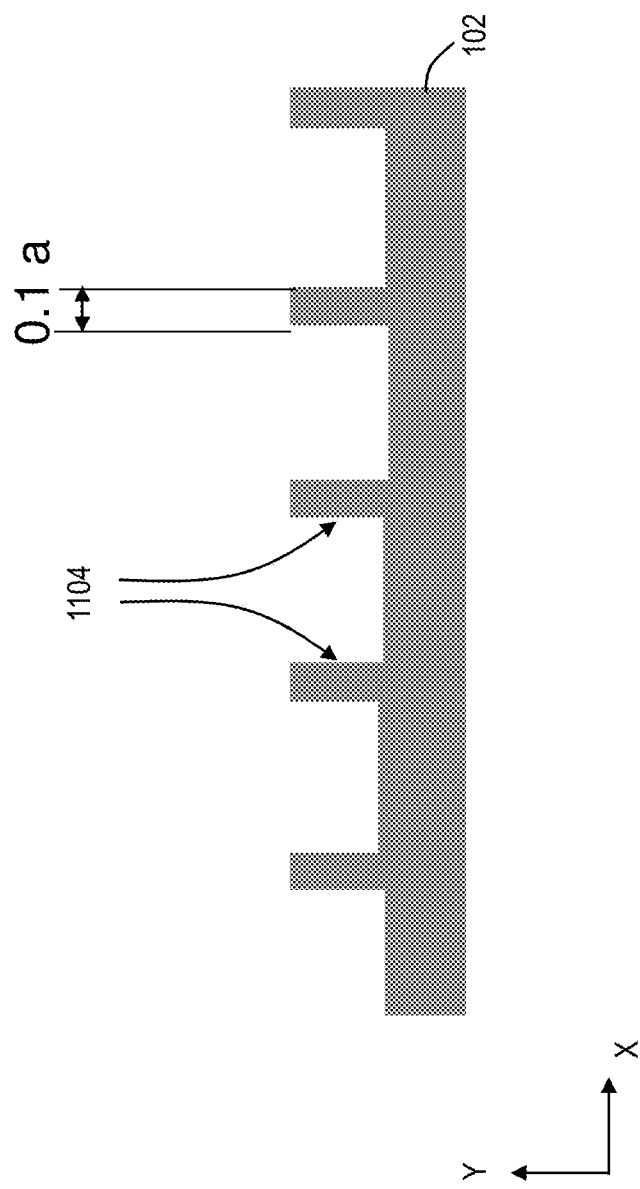
FIG. 12 depicts a cross-sectional view of the semiconductor device after fabrication operations according to embodiments of the invention.

Patterning fin hardmask layer 104 results in lines 1102. The lines 1102 of fin hardmask layer 104 are utilized as a mask to form fins 1104 in portions of the substrate 102. Reactive ion etching can be utilized. The fins 1104 each have a width in the x-axis of (0.1)×(a), which is the same widths as the shrunk/narrow part of trenches/spaces 318, trenches/spaces 418, lines 804 of trench fill material 702, lines 1002 of intermediary layer 106, through lines 1102 of fin hardmask layer 104. The lines 1102 of fin hardmask layer 104 are removed thereby leaving fins 1104 in substrate 102, as depicted in FIG. 12. Fins 1104 provide the basis to form transistors as understood by one skilled in the art.

Figure 13:
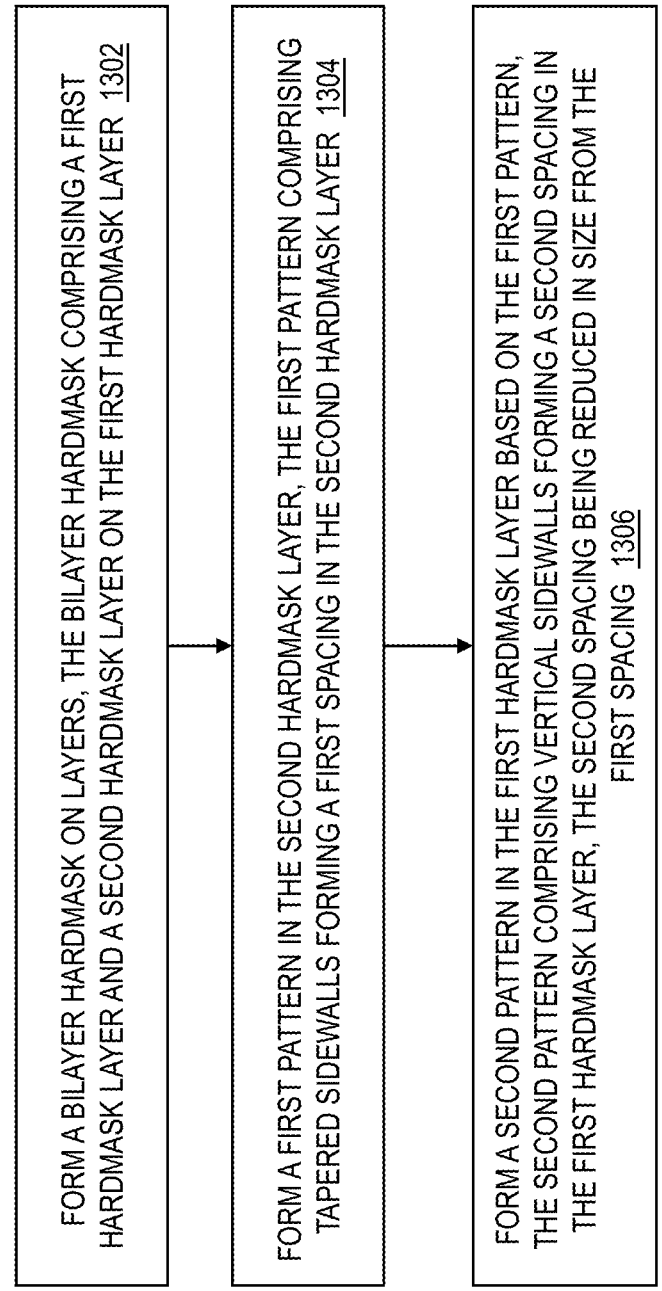
FIG. 13 is a flow chart of a method for forming a semiconductor device according embodiments of the invention.

FIG. 13 is a flow chart of a method 1300 for forming a semiconductor device 100 according embodiments of the invention. At block 1302, the method 1300 includes forming a bilayer hardmask (e.g., bilayer hardmask stack 150) on layers, the bilayer hardmask including a first hardmask layer (e.g., first hardmask layer 108) and a second hardmask layer (e.g., second hardmask layer 110) on the first hardmask layer. At block 1304, the method 1300 includes forming a first pattern (e.g., as depicted in FIG. 3) in the second hardmask layer (e.g., second hardmask layer 110), the first pattern including tapered sidewalls (e.g., tapered sidewalls 350) forming a first spacing (e.g., trenches/spaces 318) in the second hardmask layer (e.g., second hardmask layer 110). At block 1306, the method 1300 includes forming a second pattern (e.g., as depicted FIGS. 4, 5, and 6) in the first hardmask layer (e.g., the first hardmask layer 108) based on the first pattern, the second pattern including vertical sidewalls (e.g., vertical/straight sidewalls 450) forming a second spacing (e.g., trenches/spaces 418) in the first hardmask layer, the second spacing (e.g., trenches/spaces 418) being reduced in size from the first spacing (e.g., trenches/spaces 318).

The method can include removing the second hardmask layer. Also, the method can include filling the second spacing (e.g., trenches/spaces 418) with fill material (e.g., trench fill material 702). Also, the method can include removing the first hardmask layer to leave the fill material as lines (e.g., lines 804 of trench fill material 702) with an inverted pattern of the second pattern, the lines (e.g., lines 804 of trench fill material 702) having a width (e.g., (0.1)×(a)) corresponding to the second spacing. The tapered sidewalls 350 form trenches with the first spacing (e.g., trenches/spaces 318), and the vertical sidewalls 450 form trenches with the second spacing (e.g., trenches/spaces 418).

A top part of the first spacing is wider than at a bottom part, such as, for example, trenches/spaces 318 as depicted in FIGS. 3, 4, and 5. The second spacing is substantially uniform from top to bottom, for example, trenches/spaces 418 as depicted in FIGS. 4, 5, and 6. The first hardmask layer includes a different material from the second hardmask layer. The first pattern of the second hardmask layer is formed by using a photoresist material 116 having duty cycle of 1 to 1. The first pattern is formed using a direct print lithography process, the direct print lithography process being selected from the group consisting of extreme ultraviolet (EUV) lithography, optical immersion lithography, and nanoimprint lithography.

FIG. 14 is a flow chart of a method 1400 for forming fins 1104 in a semiconductor device 100 according to embodiments of the invention. At block 1402, the method 1400 includes forming a bilayer hardmask (e.g., bilayer hardmask stack 150) on layers, the bilayer hardmask including a first hardmask layer (e.g., first hardmask layer 108) and a second hardmask layer (e.g., second hardmask layer 110) on the first hardmask layer. At block 1404, the method 1400 includes forming a first pattern (e.g., as depicted in FIG. 3) in the second hardmask layer, the first pattern including tapered sidewalls (e.g., tapered sidewalls 350) forming a first spacing (e.g., trenches/spaces 318) in the second hardmask layer. At block 1406, the method 1400 includes forming a second pattern (e.g., as depicted FIGS. 4, 5, and 6) in the first hardmask layer (e.g., the first hardmask layer 108) based on the first pattern, the second pattern including vertical sidewalls (e.g., vertical/straight sidewalls 450) forming a second spacing in the first hardmask layer, the second spacing (e.g., trenches/spaces 418) being reduced in size from the first spacing (e.g., trenches/spaces 318). Also, the method 1400 includes forming a fill material (e.g., trench fill material 702) in the second spacing responsive to removing the second hardmask layer at block 1408, forming lines of the fill material (e.g., lines 804 of trench fill material 702) responsive to removing the first hardmask layer (e.g., first hardmask layer 108) at block 1410, and using the lines (e.g., lines 804 of trench file material 702) to eventually form the fins 1104 in one (e.g., substrate 102) of the layers at block 1412.

The layers include a substrate 102, a first layer (e.g., fin hardmask layer 104) formed on the substrate, and a second layer (e.g., intermediary layer 106) formed on the first layer. The lines (e.g., lines 804 of trench file material 702) are used as a mask to form structures in the second layer (e.g., lines 1002 in intermediary layer 106). The structures are used as another mask to form other structures in the first layer (e.g., lines 1102 in fin hardmask layer 104), responsive to removing the lines (e.g., lines 1002 in intermediary layer 106). The fins 1104 remain responsive to removing the first layer (e.g., fin hardmask layer 104).

FIG. 15 is a flow chart of a method 1500 of forming a semiconductor device 100 according to embodiments of the invention. The method 1500 includes forming a bilayer hardmask (e.g., bilayer hardmask stack 150) including a first hardmask layer and a second hardmask layer on the first hardmask layer, the bilayer hardmask being formed over a substrate 102, as block 1502. At block 1504, the method 1500 includes forming a first spacing with tapered sidewalls (e.g., trenches/spaces 318 with tapered sidewalls 350) in the second hardmask layer (e.g., second hardmask layer 110). At block 1506, the method 1500 includes forming a second spacing with vertical sidewalls (e.g., trenches/spaces 418 with vertical/straight sidewalls 450) in the first hardmask layer (e.g., first hardmask layer 108), the second spacing being formed using the first spacing, a width of the second spacing corresponding to a bottom portion (e.g., having the narrowest/smallest width depicted in FIG. 3) of the first spacing but not a top portion (e.g., having the widest/greatest width depicted in FIG. 3) of the first spacing.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    forming a bilayer hardmask on layers, the bilayer hardmask comprising a first hardmask layer and a second hardmask layer on the first hardmask layer, the first hardmask layer being in contact with an intermediary layer of the layers;
    forming a first pattern in the second hardmask layer, the first pattern comprising tapered sidewalls forming a first spacing in the second hardmask layer; and
    forming a second pattern in the first hardmask layer based on the first pattern such that a top of the intermediary layer is exposed, the second pattern comprising vertical sidewalls forming a second spacing in the first hardmask layer, the second spacing being reduced in size from the first spacing, wherein the intermediary layer is patterned to a size according to the second spacing.

2. The method of claim 1 further comprising removing the second hardmask layer.

3. The method of claim 2 further comprising filling the second spacing with fill material.

4. The method of claim 3 further comprising removing the first hardmask layer to leave the fill material as lines with an inverted pattern of the second pattern, the lines having a width corresponding to the second spacing.

5. The method of claim 1, wherein:
    the tapered sidewalls form trenches with the first spacing; and
    the vertical sidewalls form trenches with the second spacing.

6. The method of claim 1, wherein a top part of the first spacing is wider than at a bottom part.

7. The method of claim 1, wherein the second spacing is substantially uniform from top to bottom.

8. The method of claim 1, wherein the first hardmask layer comprises a different material from the second hardmask layer.

9. The method of claim 1, wherein the first pattern of the second hardmask layer is formed using a photoresist material having duty cycle of 1 to 1.

10. The method of claim 1, wherein the first pattern is formed using a direct print lithography process, the direct print lithography process being selected from the group consisting of extreme ultraviolet (EUV) lithography, optical immersion lithography, and nanoimprint lithography.

11. A method of forming fins in a semiconductor device, the method comprising:
    forming a bilayer hardmask on layers, the bilayer hardmask comprising a first hardmask layer and a second hardmask layer on the first hardmask layer;
    forming a first pattern in the second hardmask layer, the first pattern comprising tapered sidewalls forming a first spacing in the second hardmask layer;
    forming a second pattern in the first hardmask layer based on the first pattern, the second pattern comprising vertical sidewalls forming a second spacing in the first hardmask layer, the second spacing being reduced in size from the first spacing;
    forming a fill material in the second spacing responsive to removing the second hardmask layer;
    forming lines of the fill material responsive to removing the first hardmask layer; and
    using the lines to form the fins in one of the layers.

12. The method of claim 11, wherein the layers comprise a substrate, a first layer formed on the substrate, and a second layer formed on the first layer.

13. The method of claim 12, wherein the lines are used as a mask to form structures in the second layer.

14. The method of claim 13, wherein the structures are used as another mask to form other structures in the first layer, responsive to removing the lines.

15. The method of claim 14, wherein the fins remain responsive to removing the first layer.

16. The method of claim 11, wherein:
    the tapered sidewalls form trenches with the first spacing;
    the vertical sidewalls form trenches with the second spacing; and
    the first hardmask layer comprises a different material from the second hardmask layer.

17. The method of claim 11, wherein a top part of the first spacing is wider than at a bottom part.

18. The method of claim 11, wherein the second spacing is substantially uniform from top to bottom.

19. The method of claim 11, wherein:
- the first pattern of the second hardmask layer is formed using a photoresist material having duty cycle of 1 to 1; and
- the first pattern is formed using a direct print lithography process, the direct print lithography process being selected from the group consisting of extreme ultraviolet (EUV) lithography, optical immersion lithography, and nanoimprint lithography.

20. A method of forming a semiconductor device, the method comprising:
- forming a bilayer hardmask comprising a first hardmask layer and a second hardmask layer on the first hardmask layer, the bilayer hardmask being formed over a layers, the first hardmask layer being in contact with an intermediary layer of the layers;
- forming a first spacing with tapered sidewalls in the second hardmask layer; and
- forming a second spacing with vertical sidewalls in the first hardmask layer such that a top of the intermediary layer is exposed, the second spacing being formed using the first spacing, a width of the second spacing corresponding to a bottom portion of the first spacing but not a top portion of the first spacing, wherein the intermediary layer is patterned to a size according to the second spacing.

* * * * *